United States Patent [19]
Li et al.

[11] Patent Number: 5,928,969
[45] Date of Patent: Jul. 27, 1999

[54] METHOD FOR CONTROLLED SELECTIVE POLYSILICON ETCHING

[75] Inventors: Li Li, Meridian; Richard C. Hawthorne, Nampa, both of Id.

[73] Assignee: Micron Technology, Inc., Boise, Id.

[21] Appl. No.: 08/589,776

[22] Filed: Jan. 22, 1996

[51] Int. Cl.$^6$ ................................................ H01L 21/302
[52] U.S. Cl. ......................... 438/753; 438/924; 438/964; 252/79.1
[58] Field of Search .............................. 156/644.1, 653.1, 156/662.1; 252/79.1; 437/919, 52, 60; 438/753, 924, 964

[56] References Cited

U.S. PATENT DOCUMENTS

| | | | |
|---|---|---|---|
| 3,839,111 | 10/1974 | Ham et al. ................................. | 156/8 |
| 3,909,325 | 9/1975 | Church et al. ......................... | 156/662.1 |
| 4,087,367 | 5/1978 | Rioult et al. ............................ | 252/79.1 |
| 4,113,551 | 9/1978 | Bassous et al. ....................... | 156/662.1 |
| 4,137,123 | 1/1979 | Bailey et al. .......................... | 156/662.1 |
| 4,230,522 | 10/1980 | Martin et al. ........................... | 252/79.3 |
| 5,030,590 | 7/1991 | Amin et al. .............................. | 437/233 |
| 5,147,499 | 9/1992 | Szwejkowski .......................... | 156/643 |
| 5,296,093 | 3/1994 | Szwejkowski .......................... | 156/643 |
| 5,342,800 | 8/1994 | Jun .......................................... | 437/919 |
| 5,358,888 | 10/1994 | Ahn et al. ............................... | 437/919 |
| 5,431,777 | 7/1995 | Austin et al. .......................... | 156/662.1 |
| 5,447,882 | 9/1995 | Kim ......................................... | 437/919 |
| 5,464,791 | 11/1995 | Hirota .................................... | 437/919 |
| 5,478,769 | 12/1995 | Lim ........................................ | 437/919 |
| 5,518,966 | 5/1996 | Woo ..................................... | 156/662.1 |
| 5,538,592 | 7/1996 | Chen et al. ............................. | 437/919 |
| 5,554,303 | 9/1996 | Kaneko et al. ............................. | 216/2 |
| 5,629,223 | 5/1997 | Thakur .................................... | 438/398 |
| 5,637,523 | 6/1997 | Fazan et al. ............................. | 438/397 |

FOREIGN PATENT DOCUMENTS

| | | |
|---|---|---|
| 732738 | 9/1996 | European Pat. Off. . |
| 7-122652 | 5/1995 | Japan . |

OTHER PUBLICATIONS

Sakao et al., "A capacitor–over–bit–line (COB) cell with a hemispherical–grain storage node for 64 Mb DRAMs" IEDM 90, IEEE pp. 655–658 (1990).

Woo et al., "Selective Etching Tech. of in–situ P Doped Poly–Si (SEPOP) for high density DRAM capacitors" 1994 Symp. on VLSI Tech. Dig Tech. Papers, IEEE pp. 25–26 (1994).

Lee, D.B. "Anisotropic etching of silica" J. Appl. Phys. vol. 40, #11, pp. 4569–4574 (Oct. 1969).

Seidel, H. et al. "Anisotropic etching of crystalline silicon in alkaline solutions" J. El. Soc. vol. 137, #11, pp. 3612–3626 (Nov. 1990).

Robbins H. et al. "Chemical Etching of Silicon" J. Electrochem. Soc., vol. 106, No. 6, pp. 505–508 (Jun. 1959).

Robbins H. et al. "Chemical Etching of Silicon" J. Electrochem. Soc., vol. 7, No. 2, pp. 108–111 (Feb. 1960).

Kim, S T et al, Characteristics of the NO Dielectric Film in the MTS (Micro–Trench Storage) Capacitor Structure, Handotai, Shuseki Kairo Gijutsu Shinpojiumu Koen Ronbunshu (Proceedings of the Symposium on Semiconductors and Integrated Circuits Technology), 1992.

*Primary Examiner*—R. Bruce Breneman
*Assistant Examiner*—Anita Alanko
*Attorney, Agent, or Firm*—Norman, Nydegger & Seeley

[57] ABSTRACT

An ammonia-based etchant is employed, in dilute aqueous solution and preferably with a moderating agent, to etch polysilicon. Ammonium fluoride and ammonium hydroxide are the preferred etchants, with acetic acid and isopropyl alcohol the preferred moderating agents for use with the respective etchants. Dilute solutions of these etchants and their respective moderating agents provide a controllable, uniform polysilicon etch with reasonably good selectivity to undoped polysilicon over doped polysilicon. A dilute solution of ammonium fluoride and acetic acid provides particularly good selectivity. These etchants are applied to the etching of doped polysilicon upon which undoped hemispherical grain (HSG) polysilicon has been formed. The undoped HSG polysilicon is etched at a slower rate than the doped polysilicon which is etched at a greater but controllable and uniform rate. The result is a surface with greater total surface area contained within the same wafer area. This allows an increase in capacitance for capacitors formed with HSG polysilicon, without any increase in wafer area occupied thereby.

28 Claims, 1 Drawing Sheet

METHOD FOR CONTROLLED SELECTIVE POLYSILICON ETCHING

BACKGROUND OF THE INVENTION

1. The Field of the Invention

The present invention relates to the manufacture of semiconductor devices. More particularly, the present invention is directed to methods for controlled, selective, polysilicon etching useful in the fabrication of semiconductor devices employing polysilicon.

2. The Relevant Technology

Polysilicon is extensively employed in the fabrication of silicon based semiconductor devices. Traditionally, wet etchants for polysilicon are the same as, or very similar to, wet etchants used for single crystal silicon. Wet etchants for polysilicon thus generally include hydrofluoric and nitric acids in solution with water or acetic acid. Such traditional polysilicon etchants etch polysilicon quite rapidly, as fast as 3000 Angstroms per minute, but cannot be significantly diluted without losing virtually all etching ability. Traditional polysilicon etchants also tend to produce non-uniform etch rates over the surface of a wafer, possibly because of autocatalysis, or because the reaction involved proceeds faster at high temperatures and is exothermic so that the reaction speed is increased by the heat produced by the reaction itself. Because of these characteristics, traditional polysilicon wet etchants are useful only where an entire layer of polysilicon and/or silicon must be removed. For carefully controlled partial etching of polysilicon layers, new etching technology is needed.

In the continuing quest for increased miniaturization of memory circuits, the area of a chip occupied by a capacitor in DRAM circuits, and in circuits of similar technologies, must be decreased. But capacitance is a function of capacitor plate area, and capacitance must remain large enough to provide a clear, reliable signal at each refresh cycle, or else memory integrity is lost. Ways to increase capacitance of capacitors in DRAM and related circuits are thus needed.

SUMMARY AND OBJECTS OF THE INVENTION

An object of the present invention is to provide a method for highly controlled, uniform polysilicon etching.

Another object of the present invention is to provide a method for increasing the capacitance of a capacitor in a semiconductor device without increasing the area of the wafer occupied by the capacitor.

Still another object of the present invention is to provide a method of increasing the surface area of a surface including hemispherical grain polysilicon.

Yet another object of the present invention is to provide a method for etching polysilicon in a controlled, uniform manner, which method etches doped polysilicon with good selectivity to undoped hemispherical grain polysilicon.

Still another object of the present invention is to provide a method for etching polysilicon in a controlled, uniform manner, which method allows decreased use of expensive and hazardous chemicals.

In accordance with the present invention, an ammonia-based etchant is employed, in solution with a moderating agent, to etch polysilicon. Ammonium fluoride and ammonium hydroxide are the preferred etchants, with acetic acid and isopropyl alcohol the preferred moderating agents for use with the respective etchants. Dilute solutions of these etchants and their respective moderating agents provide a controllable, uniform polysilicon etch with reasonably good selectivity to undoped hemispherical grain polysilicon over doped polysilicon. A dilute solution of ammonium fluoride and acetic acid provides particularly good selectivity.

The methods of the present invention find particular utility in etching doped polysilicon upon which undoped hemispherical grain (HSG) polysilicon has been formed. The undoped HSG polysilicon is etched only slowly, while the doped polysilicon is etched at a greater but controllable and uniform rate. The result is a surface with greater total surface area contained within the same wafer area. This allows an increase in capacitance for capacitors formed with HSG polysilicon, without any increase in wafer area occupied thereby.

The dilute nature of the preferred solutions results in less use of expensive and hazardous chemicals.

These and other objects and features of the present invention will become more fully apparent from the following description and appended claims, or may be learned by the practice of the invention as set forth hereinafter.

BRIEF DESCRIPTION OF THE DRAWINGS

In order that the manner in which the above-recited and other advantages and objects of the invention are obtained may be more fully explained, a more particular description of the invention briefly described above will be rendered below and with reference to a specific application thereof which is illustrated in the appended drawings. Understanding that these drawings depict only one application of the invention and are not therefore to be considered to be limiting of its scope, the invention will be described and explained with additional specificity and detail through the use of the accompanying drawings in which.

DETAILED DESCRIPTION OF THE PREFERRED EMBODIMENTS

Figure 1:
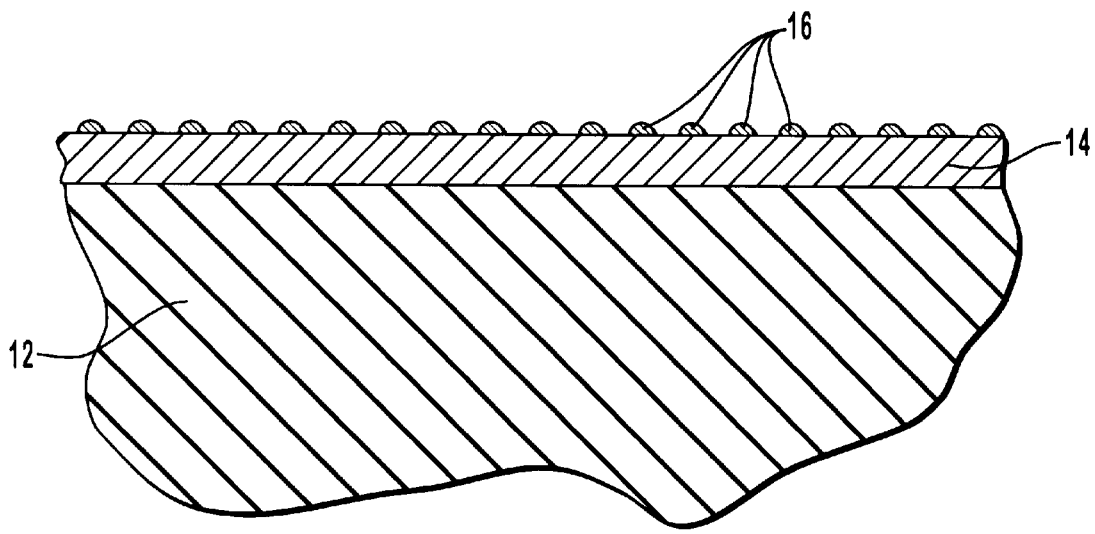
FIG. 1 is a cross section of a portion of a partially formed capacitor in a partially formed semiconductor device before etching according to the methods of the present invention.

The present invention introduces methods for the controlled and uniform etching of polysilicon, as well as a particularly useful application of such controlled etching in the formation of capacitors in semiconductor devices.

The methods according to the present invention involve etching doped polysilicon and undoped HSG polysilicon in dilute aqueous solutions of ammonia-containing etchants with moderating agents. The ammonia-containing etchants are mild etchants, and the moderating agents further improve the uniformity and controllability of the resulting etch.

The preferred ammonia-containing etchants are ammonium hydroxide ($NH_4OH$) and ammonium fluoride ($NH_4F$). The preferred moderating agents are isopropyl alcohol for ammonium hydroxide, and acetic acid for ammonium fluoride, although other moderating agents such as methanol, ethanol, and acetone may also be employed. Ammonium fluoride may also be beneficially employed in the methods of the present invention even without a moderating agent. The currently most preferred mixtures are described in detail below.

For ammonium hydroxide, the currently preferred etching solution is a mixture resulting from the combination of about 0.05 to 10 percent ammonium hydroxide (in the form of a }

29% aqueous solution of ammonium hydroxide) and about 0.5 to 10 percent isopropyl alcohol with water. Most preferred is a solution comprising a mixture resulting from the combination of about one part ammonium hydroxide (29%) to about ten parts isopropyl alcohol to about five hundred parts water. With this mixture, etch rates of approximately 43 Angstroms per minute for doped polysilicon having a dopant concentration of about $10^{19}$–$10^{20}$ atoms/cm$^3$ phosphorous, and 18 Angstroms per minute for undoped HSG polysilicon have been obtained, with good etch uniformity over the wafer surface, and good control from wafer to wafer and etch to etch.

For ammonium fluoride alone, the preferred etching solution is a mixture resulting from the combination of about 1 to 10 percent ammonium fluoride with water, and most preferred is about one part ammonium fluoride (40% solution) to about ten parts water. With this mixture, etch rates of approximately 108 Angstroms per minute for doped polysilicon having a dopant concentration of about $10^{19}$–$10^{20}$ atoms/cm$^3$ phosphorous, and 35 Angstroms per minute for undoped HSG polysilicon have been obtained, again with good etch uniformity over the wafer surface and good control from wafer to wafer and etch to etch.

More preferred is the use of ammonium fluoride with acetic acid as a moderating agent, in the form of an etching solution resulting form the combination of about 1 to 10 percent ammonium fluoride and about 0.1 to 1 percent acetic acid with water. Most preferred is the etching solution resulting from the combination of about fifty parts ammonium fluoride (40% solution) to about one part acetic acid to about five hundred parts water by volume. With this mixture, etch rates of approximately 55 Angstroms per minute for doped polysilicon having a dopant concentration of about $10^{19}$–$10^{20}$ atoms/cm$^3$ phosphorous, and 9 Angstroms per minute for undoped HSG polysilicon have been obtained, providing particularly good selectivity to undoped HSG polysilicon.

A presently preferred application of the methods of the present invention may be illustrated with reference to FIGS. 1 and 2.

FIG. 1 is a cross section of a portion of a partially formed capacitor in a partially formed semiconductor device before etching according to the methods of the present invention. At least one of the plates of the capacitor is to be formed of polysilicon. Accordingly, a doped polysilicon layer 14 has been formed on an underlying layer 12. An HSG layer 16 made of undoped HSG polysilicon has been formed on a doped polysilicon layer 14, preferably by deposition of the undoped HSG polysilicon with a thickness within a range of about 300 to 600 Angstroms followed by an anneal. The anneal may begin with a conventional seeding step. HSG layer 16, seen the Figures, includes individual grains separated by spaces.

HSG polysilicon improves the capacitance of a capacitor formed therewith by virtue of the increased surface area of the resulting polysilicon surface, consisting in FIG. 1 by way of example of the exposed portions of the upward surface of doped polysilicon layer 14 and the upward facing surfaces of layer of HSG layer 16. The methods of the present invention may be employed to further increase the surface area of the structure shown in FIG. 1 by etching so as to remove a portion of doped polysilicon layer 14 at the spaces between the grains of HSG layer 16.

Figure 2:
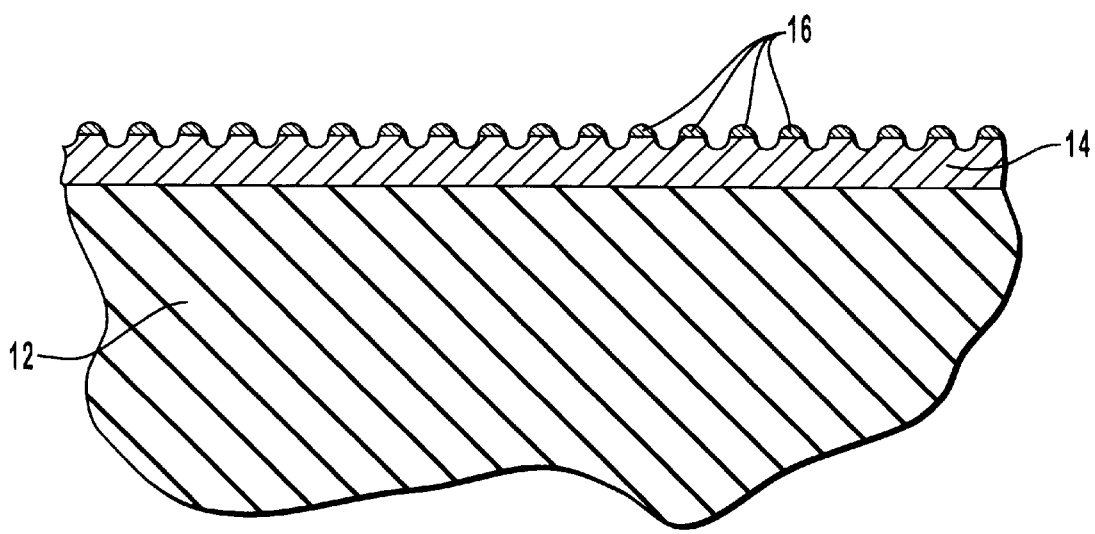
FIG. 2 is the cross section of FIG. 1 after etching according to the methods of the present invention.

The results of such an etch are shown in FIG. 2. Doped polysilicon layer 14 has been etched by approximately 50 to 200 Angstroms, most preferably about 100 Angstroms. The method of etching, selected from those described above, is selective to undoped HSG polysilicon, so HSG layer 16 remains essentially intact. The result is an increase in the exposed surface area of doped polysilicon layer 14. This provides increased capacitance for a capacitor having a plate or plates formed of layers 14, 16 without increasing the area of the wafer occupied by the capacitor. Alternatively, this method may of course be used to reduce the overall area of the wafer occupied by a capacitor, while maintaining its capacitance at a desired level.

The methods of the present invention may of course also be employed during any other fabrication step where it is desirable to etch doped polysilicon selectively to undoped HSG polysilicon, and to any fabrication step where a uniform, controlled etch of polysilicon is desired.

The present invention may be embodied in other specific forms without departing from its spirit or essential characteristics. The described embodiments are to be considered in all respects only as illustrative and not restrictive. The scope of the invention is, therefore, indicated by the appended claims rather than by the foregoing description. All changes which come within the meaning and range of equivalency of the claims are to be embraced within their scope.

What is claimed and desired to be secured by United States Letters Patent is:

1. A method for etching polysilicon during the fabrication of a semiconductor device, said method comprising etching of a polysilicon film in a wet etch solution comprising a dilute solution of ammonium fluoride etchant, acetic acid moderating agent, and water.

2. The method as defined in claim 1, wherein the wet etch solution comprises a mixture resulting from the combination of about 1 to 10 percent ammonium fluoride and about 0.1 to 1 percent acetic acid with water.

3. The method as defined in claim 1, wherein the wet etch solution comprises a mixture resulting from the combination of about fifty parts 40% ammonium fluoride to about one part acetic acid to about five hundred parts water by volume.

4. A method of etching doped polysilicon selectively to undoped hemispherical grain polysilicon, said method comprising:

forming a layer of doped polysilicon and a superadjacent layer of undoped hemispherical grain polysilicon comprising hemispherical grains of polysilicon separated by spaces;

etching the layer doped polysilicon and the layer of undoped hemispherical grain polysilicon in an etchant comprising a mixture resulting from a combination of about 1 to 10 percent ammonium fluoride and about 0.1 to 1 percent acetic acid with water.

5. A method of increasing the surface area of a surface including hemispherical grain polysilicon during the fabrication of a semiconductor device, said method comprising:

forming a layer of doped polysilicon;

forming on said layer of doped polysilicon a layer of undoped hemispherical grain polysilicon comprising hemispherical grains of polysilicon separated by spaces; and wet etching said layer of doped polysilicon and said layer of undoped hemispherical grain polysilicon in an etchant selective to undoped hemispherical grain polysilicon.

6. The method as defined in claim 5, where in the doped polysilicon layer has a surface area exposed through the layer of undoped hemispherical grain polysilicon, and wherein the step of etching said layer of doped polysilicon and said layer of undoped hemispherical grain polysilicon comprises etching said layer of doped polysilicon and said layer of undoped hemispherical grain polysilicon in an etchant selective to undoped hemispherical grain polysilicon for a time sufficient to remove a portion of said layer of doped polysilicon having a thickness in a range of about 300 to 600 Angstroms, whereby the surface area exposed through the layer of undoped hemispherical grain polysilicon is increased.

7. The method as defined in claim 5, wherein etching said layer of doped polysilicon and said layer of undoped hemispherical grain polysilicon comprises etching in a wet etch solution comprising a dilute solution of an ammonia-containing etchant and a moderating agent.

8. The method as defined in claim 7, wherein the wet etch solution comprises an ammonia-containing etchant selected from the group consisting of ammonium hydroxide and ammonium fluoride.

9. The method as defined in claim 7, wherein the wet etch solution comprises a dilute solution of an ammonium hydroxide etchant and an isopropyl alcohol moderating agent.

10. The method as defined in claim 9, wherein the dilute solution comprises a mixture resulting from the combination of about 0.05 to 10 percent ammonium hydroxide and about 0.5 to 10 percent isopropyl alcohol with water.

11. The method as defined in claim 10, wherein the dilute solution comprises a mixture resulting from the combination of about one part ammonium hydroxide to about ten parts isopropyl alcohol to about five hundred parts water.

12. The method as defined in claim 7, wherein the wet etch solution comprises a dilute solution of an ammonium fluoride etchant and an acetic acid moderating agent.

13. The method as defined in claim 12, wherein the dilute solution comprises a mixture resulting from the combination of about 1 to 10 percent ammonium fluoride and 0.1 to 1 percent acetic acid with water.

14. The method as defined in claim 13, wherein the dilute solution comprises a mixture resulting from the combination of about fifty parts 40% ammonium fluoride to about one part acetic acid to about five hundred parts water by volume.

15. The method as defined in claim 5, wherein etching said layer of doped polysilicon and said layer of undoped hemispherical grain polysilicon comprises etching in a solution resulting from a combination of about 0.05 to 10 percent ammonium hydroxide and about 0.1 to 1 percent isopropyl alcohol with water until a thickness in a range of about 50 to 200 Angstroms of said layer of doped polysilicon is etched away.

16. The method as defined in claim 5, wherein etching said layer of doped polysilicon and said layer of undoped hemispherical grain polysilicon in an etchant selective to undoped hemispherical grain polysilicon comprises etching in a solution resulting from the combination of about 1 to 10 percent ammonium fluoride and about 0.1 to 1 percent acetic acid with water until a thickness in a range of about 50 to 200 Angstroms of said layer of doped polysilicon is etched away.

17. The method as defined in claim 5, wherein etching said layer of doped polysilicon and said layer of undoped hemispherical grain polysilicon comprises etching in a wet etch solution comprising an ammonia fluoride.

18. A method of increasing the surface area of a surface including hemispherical grain polysilicon during the fabrication of a semiconductor device, said method comprising:

forming a layer of doped polysilicon;

forming on said layer of doped polysilicon a layer of undoped hemispherical grain polysilicon comprising hemispherical grains of polysilicon separated by spaces; and etching said layer of doped polysilicon and said layer of undoped hemispherical grain polysilicon in an etchant selective to undoped hemispherical grain polysilicon, said etchant being a wet etch solution comprising a dilute solution of an ammonia-containing etchant and a moderating agent.

19. The method as defined in claim 18, wherein the wet etch solution comprises an ammonia-containing etchant selected from the group consisting of ammonium hydroxide and ammonium fluoride.

20. The method as defined in claim 18, wherein the wet etch solution comprises a dilute solution of an ammonium hydroxide etchant and an isopropyl alcohol moderating agent.

21. The method as defined in claim 20, wherein the dilute solution comprises a mixture resulting from the combination of about 0.05 to 10 percent ammonium hydroxide and about 0.5 to 10 percent isopropyl alcohol with water.

22. The method as defined in claim 21, wherein the dilute solution comprises a mixture resulting from the combination of about one part ammonium hydroxide to about ten parts isopropyl alcohol to about five hundred parts water.

23. The method as defined in claim 18, wherein the wet etch solution comprises a dilute solution of an ammonium fluoride etchant and an acetic acid moderating agent.

24. The method as defined in claim 23, wherein the dilute solution comprises a mixture resulting from the combination of about 1 to 10 percent ammonium fluoride and 0.1 to 1 percent acetic acid with water.

25. The method as defined in claim 24, wherein the dilute solution comprises a mixture resulting from the combination of about fifty parts 40% ammonium fluoride to about one part acetic acid to about five hundred parts water by volume.

26. A method of increasing the surface area of a surface including hemispherical grain polysilicon during the fabrication of a semiconductor device, said method comprising:

forming a layer of doped polysilicon;

forming on said layer of doped polysilicon a layer of undoped hemispherical grain polysilicon comprising hemispherical grains of polysilicon separated by spaces; and etching said layer of doped polysilicon and said layer of undoped hemispherical grain polysilicon in an etchant selective to undoped hemispherical grain polysilicon until a thickness in a range of about 50 to 200 Angstroms of said layer of doped polysilicon is etched away, wherein said etchant comprises a solution resulting from a combination of about 0.05 to 10 percent ammonium hydroxide and about 0.1 to 1 percent isopropyl alcohol with water until a thickness in a range of about 50 to 200 Angstroms of said layer of doped polysilicon is etched away.

27. A method of increasing the surface area of a surface including hemispherical grain polysilicon during the fabrication of a semiconductor device, said method comprising:

forming a layer of doped polysilicon;

forming on said layer of doped polysilicon a layer of undoped hemispherical grain polysilicon comprising hemispherical grains of polysilicon separated by spaces; and etching said layer of doped polysilicon and said layer of undoped hemispherical grain polysilicon in an etchant selective to undoped hemispherical grain polysilicon until a thickness in a range of about 50 to 200 Angstroms of said layer of doped polysilicon is etched away, wherein said etchant comprises a solution resulting from the combination of about 1 to 10 percent ammonium fluoride and about 0.1 to 1 percent acetic acid with water.

28. A method of increasing the surface area of a surface including hemispherical grain polysilicon during the fabrication of a semiconductor device, said method comprising:

forming a layer of doped polysilicon;

forming on said layer of doped polysilicon a layer of undoped hemispherical grain polysilicon comprising hemispherical grains of polysilicon separated by spaces; and etching said layer of doped polysilicon and said layer of undoped hemispherical grain polysilicon in an etchant selective to undoped hemispherical grain polysilicon, said etchant comprising a wet etch solution comprising an ammonia fluoride.

* * * * *

UNITED STATES PATENT AND TRADEMARK OFFICE
CERTIFICATE OF CORRECTION

PATENT NO. : 5,928,969
DATED : Jul. 27, 1999
INVENTOR(S) : Li Li; Richard C. Hawthorne It is certified that error appears in the above-identified patent and that said Letters Patent is hereby corrected as shown below:

Col. 2, line 12, after "allows" insert --for--

Col. 3, line 26, after "resulting" change "form" to --from--

Col. 3, line 60, before "HSG" delete "layer of"

Col. 4, line 46, after "layer" insert --of--

Col. 4, line 64, after "5," change "where in" to --wherein--

Signed and Sealed this

Thirtieth Day of May, 2000

Attest:

Q. TODD DICKINSON

*Attesting Officer*     Director of Patents and Trademarks